(12) United States Patent
Ohtsuka

(10) Patent No.: US 7,796,661 B2
(45) Date of Patent: Sep. 14, 2010

(54) SEMICONDUCTOR LASER

(75) Inventor: Kenichi Ohtsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/354,984

(22) Filed: Jan. 16, 2009

(65) Prior Publication Data

US 2009/0190622 A1    Jul. 30, 2009

(30) Foreign Application Priority Data

Jan. 29, 2008   (JP)   ............... 2008-017309

(51) Int. Cl.
*H01S 5/00* (2006.01)

(52) U.S. Cl. .............. 372/45.011; 372/43.01; 372/45.01

(58) Field of Classification Search ............... 372/43.1, 372/45.1, 43.01, 45.011
See application file for complete search history.

(56) References Cited

U.S. PATENT DOCUMENTS

| | | | |
|---|---|---|---|
| 4,365,336 A * | 12/1982 | Sugino et al. ............ | 372/45.01 |
| 5,022,036 A * | 6/1991 | Suyama et al. ........... | 372/45.01 |
| 6,884,648 B2 | 4/2005 | Hasegawa et al. | |
| 7,167,489 B2 * | 1/2007 | Kawakami et al. ............ | 372/19 |
| 7,561,608 B2 * | 7/2009 | Takase .................... | 372/45.01 |
| 2004/0125842 A1 * | 7/2004 | Watanabe .................... | 372/46 |
| 2006/0007976 A1 * | 1/2006 | Watanabe et al. ......... | 372/46.01 |
| 2006/0187989 A1 * | 8/2006 | Tanaka .................... | 372/45.01 |
| 2007/0014323 A1 * | 1/2007 | Tachibana et al. ......... | 372/46.01 |
| 2008/0175293 A1 * | 7/2008 | Tanaka .................... | 372/45.01 |

FOREIGN PATENT DOCUMENTS

| | | |
|---|---|---|
| JP | 02-152292 A | 6/1990 |
| JP | 6-85389 A | 3/1994 |
| JP | 10-256645 A | 9/1998 |
| JP | 11-340558 A | 12/1999 |
| JP | 2002-158402 A | 5/2002 |
| JP | 2005-191588 A | 7/2005 |

\* cited by examiner

*Primary Examiner*—Minsun Harvey
*Assistant Examiner*—Phillip Nguyen
(74) *Attorney, Agent, or Firm*—Leydig, Voit & Mayer, Ltd.

(57) ABSTRACT

A semiconductor laser comprises: a semiconductor substrate and a lower cladding layer, an active layer, and an upper cladding layer on the semiconductor substrate. The layers form a resonator having opposed end surfaces. A ridge includes part of the upper cladding layer. The upper cladding layer in the ridge, proximate the resonator end surfaces, is thicker than the upper cladding layer in the ridge at a central part of the resonator.

5 Claims, 12 Drawing Sheets vicinity of resonator end surface    resonator center vicinity of resonator end surface resonator center vicinity of resonator end surface    resonator center vicinity of resonator end surface resonator center vicinity of resonator
end surface resonator center vicinity of resonator    resonator center
end surface vicinity of resonator end surface resonator center vicinity of resonator end surface resonator center vicinity of resonator end surface resonator center vicinity of resonator end surface resonator center

SEMICONDUCTOR LASER

BACKGROUND OF THE INVENTION

1. Field of the Invention

The present invention relates to a semiconductor laser capable of preventing end surface deterioration and easy to manufacture.

2. Background Art

The amount of absorption of light and the current density at end surfaces of a resonator can be reduced by increasing the bandgap of an active layer in the vicinities of the end surfaces of the resonator relative to the bandgap of the active layer at a center of the resonator of a semiconductor laser. Prevention of end surface deterioration is thus enabled (see, for example, Japanese Patent Laid-Open Nos. 2005-191588 and 10-256645).

SUMMARY OF THE INVENTION

Semiconductor lasers have been manufactured by performing selective growing using a mask. For manufacturing semiconductor lasers in such a way, a complicated manufacturing process and strict control of growing conditions are required.

In view of the above-described problem, an object of the present invention is to provide a semiconductor laser capable of preventing end surface deterioration and easy to manufacture.

According to one aspect of the present invention, a semiconductor laser comprises: a semiconductor substrate; and a lower clad layer, an active layer and an upper clad layer formed one on another on the semiconductor substrate, wherein a ridge is formed on the upper clad layer, and the thickness of the upper clad layer in the ridge in the vicinities of resonator end surfaces is larger than the thickness of the upper clad layer in the ridge at a resonator center.

According to the present invention, a semiconductor laser capable of preventing end surface deterioration and easy to manufacture can be obtained.

Other and further objects, features and advantages of the invention will appear more fully from the following description.

DETAILED DESCRIPTION OF THE PREFERRED EMBODIMENTS

First Embodiment

Figure 1:
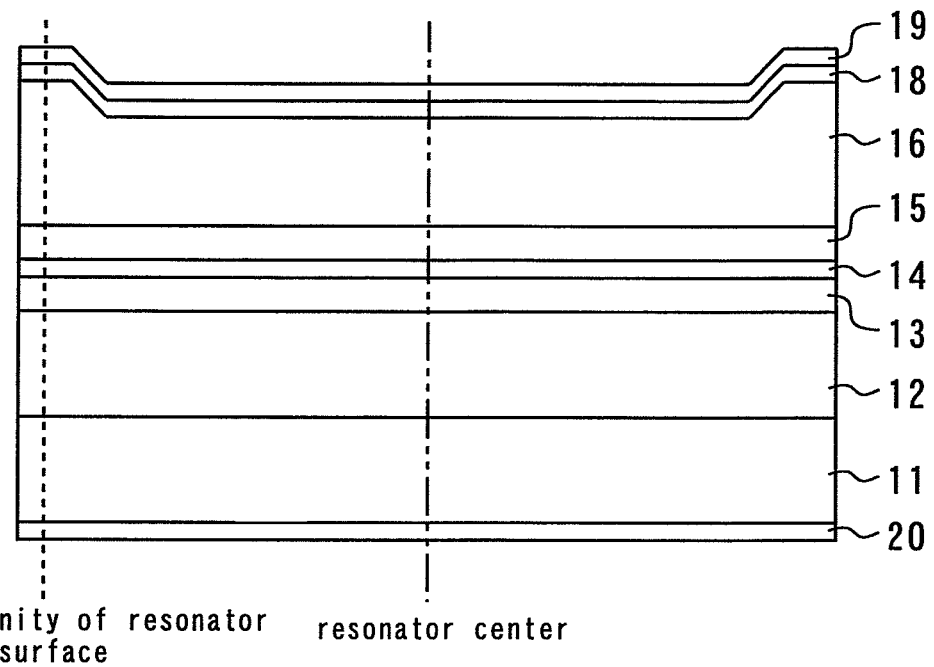
FIG. 1 is a sectional view of a semiconductor laser according to a first embodiment of the present invention taken in a direction along a resonator.
Figure 2:
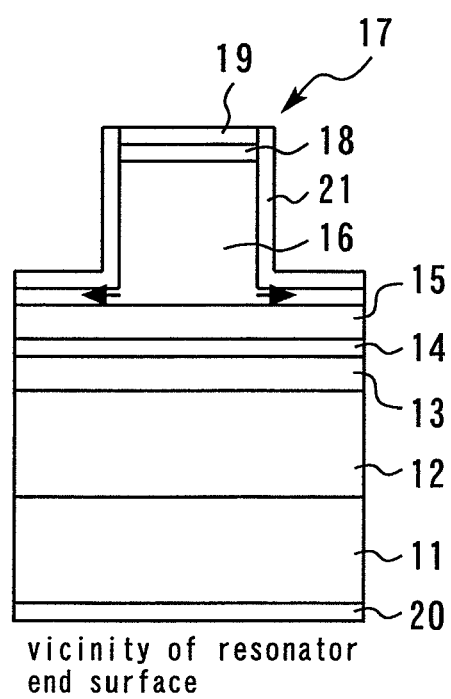
FIG. 2 is a sectional view in the vicinity of an end surface of the resonator shown in FIG. 1.
Figure 3:
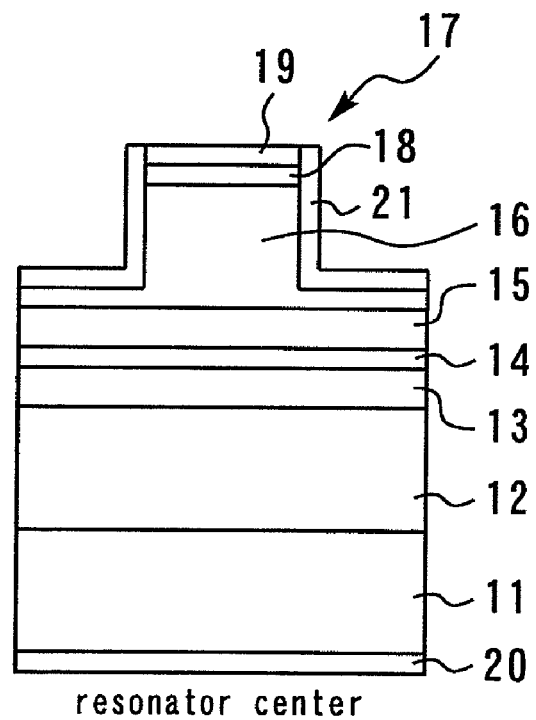
FIG. 3 is a sectional view at a center of the resonator shown in FIG. 1.

FIG. 1 is a sectional view of a semiconductor laser according to a first embodiment of the present invention taken in a direction along a resonator. FIG. 2 is a sectional view in the vicinity of an end surface of the resonator shown in FIG. 1. FIG. 3 is a sectional view at a center of the resonator shown in FIG. 1.

An n-AlGaN clad layer 12 (lower clad layer), a guide layer 13, a quantum well active layer 14 (active layer), a guide layer 15 and a p-AlGaN clad layer 16 (upper clad layer) are formed one on another on an n-GaN substrate 11 (semiconductor substrate). A ridge 17 is formed on the p-AlGaN clad layer 16. A p-GaN contact layer 18 and a p-electrode 19 are formed on the ridge 17. An n-electrode 20 is formed on the lower surface of the n-GaN substrate 11. An insulating film 21 is formed so as to cover side wall surfaces of the ridge 17 and the p-AlGaN clad layer 16 in outside of the ridge 17.

A feature of the present embodiment resides in that, in the ridge 17, the thickness of the p-AlGaN clad layer 16 in the vicinities of resonator end surfaces is larger than the thickness of the p-AlGaN clad layer 16 at a resonator center (oscillation section). In the outside of the ridge 17, in the present embodiment, the thickness of the p-AlGaN clad layer 16 in the vicinities of the resonator end surfaces and the thickness of the p-AlGaN clad layer 16 at the resonator center are equal to each other.

Figure 4:
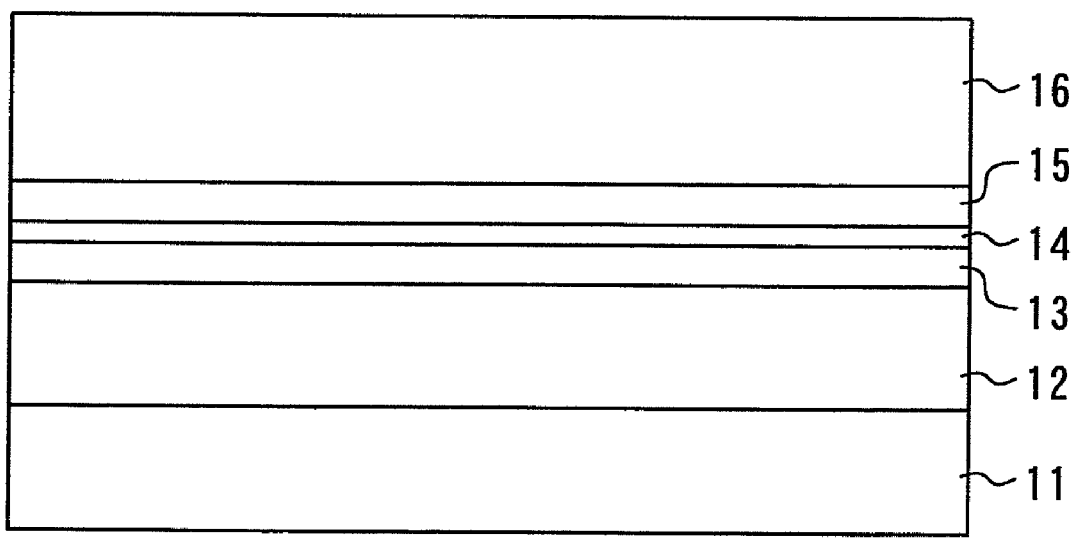
FIGS. 4-6 are sectional views for explaining a method of manufacturing a semiconductor laser according to a first embodiment of the present invention.

The process of manufacturing the semiconductor laser according to the present invention will be described. First, as shown in FIG. 4, the n-AlGaN clad layer 12, the guide layer 13, the quantum well active layer 14, the guide layer 15 and the p-AlGaN clad layer 16 are formed on the n-GaN substrate 11.

Figure 5:
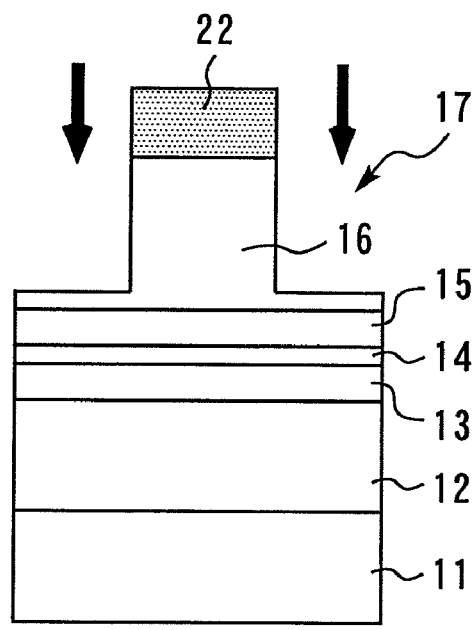

Next, as shown in FIG. 5, the ridge 17 is formed by etching the p-AlGaN clad layer 16. For this etching, a resist 22 patterned by photolithography is used as a mask.

Figure 6:
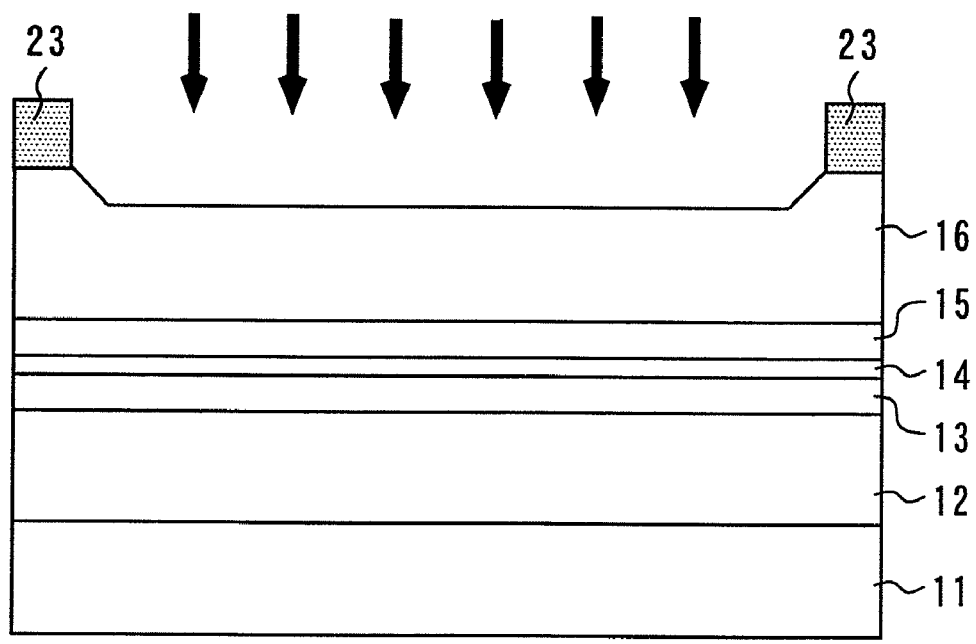

Subsequently, as shown in FIG. 6, a resist 23 is formed in the vicinities of the resonator end surfaces by photolithography. The p-AlGaN clad layer 16 is etched by using this resist 23 as a mask so that the thickness of the p-AlGaN clad layer 16 in the vicinities of the resonator end surfaces is larger than the thickness of the p-AlGaN clad layer 16 at the resonator center.

Subsequently, as shown in FIGS. 1 to 3, the p-GaN contact layer 18 and the p-electrode 19 are formed on the ridge 17. The n-electrode 20 is formed on the lower surface of the n-GaN substrate 11. The insulating film 21 is formed so as to cover the side wall surfaces of the ridge 17 and the p-AlGaN clad layer 16 in the outside of the ridge 17. The semiconductor laser according to the present embodiment is manufactured by the above-described process.

In the semiconductor laser according to the present embodiment, as described above, the thickness of the p-AlGaN clad layer 16 in the ridge 17 in the vicinities of the resonator end surfaces is larger than the thickness of the p-AlGaN clad layer 16 in the ridge 17 at the resonator center. Because compressive strain is caused in the quantum well active layer 14 having a lattice constant larger than that of the p-AlGaN clad layer 16, the bandgap of the quantum well active layer 14 in the vicinities of the resonator end surfaces is increased relative to the bandgap of the quantum well active layer 14 at the resonator center (oscillation section) by constructing the semiconductor laser according to the present embodiment. The amount of absorption of light at each resonator end surface is reduced thereby, thus enabling prevention of end surface deterioration.

In the vicinities of the resonator end surfaces where the thickness of the p-AlGaN clad layer 16 is large, a strain of the quantum well active layer 14 with respect to the p-AlGaN clad layer 16 due to the difference between the lattice constants is large. Therefore, polarized charge due to a piezoelectric effect increases at the end surfaces. For this reason, a current spreads laterally from positions below the side walls of the ridge 17, and the current density in the vicinities of the resonator end surfaces is reduced, thus enabling prevention of end surface deterioration.

The semiconductor laser according to the present embodiment can be easily manufactured by etching the p-AlGaN clad layer 16 at the resonator center.

In the semiconductor laser according to the present embodiment, the positions at which the structure of the p-AlGaN clad layer 16 is changed are at a substantial distance from the quantum well active layer 14. Therefore, changes in the light distribution and current distribution in the direction along the resonator are gradual. As a result, stable laser oscillation can be achieved.

Second Embodiment

Figure 7:
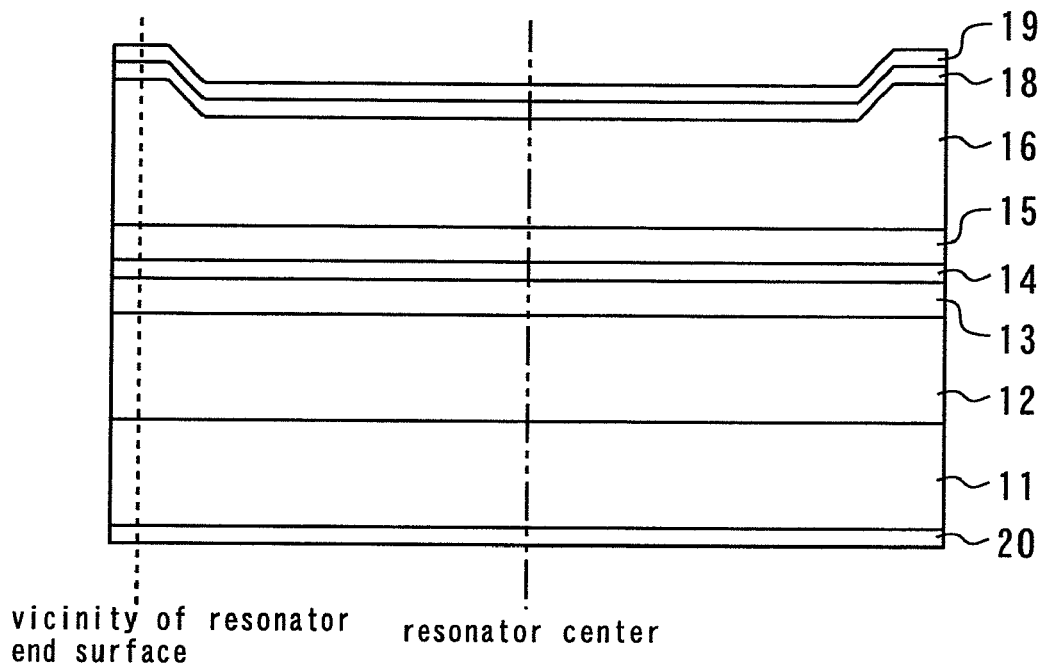
FIG. 7 is a sectional view of a semiconductor laser according to a second embodiment of the present invention taken in a direction along a resonator.
Figure 8:
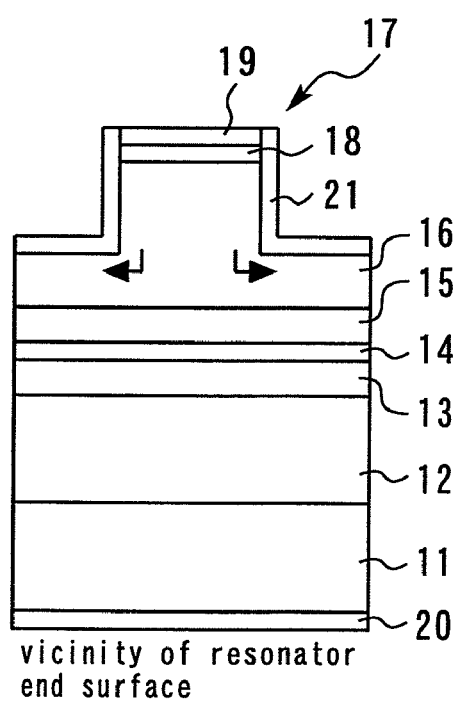
FIG. 8 is a sectional view in the vicinity of an end surface of the resonator shown in FIG. 7.
Figure 9:
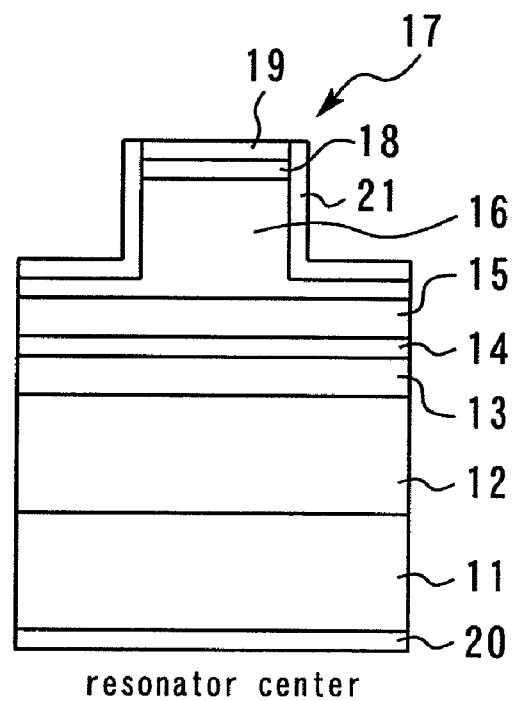
FIG. 9 is a sectional view at a center of the resonator shown in FIG. 7.

FIG. 7 is a sectional view of a semiconductor laser according to a second embodiment of the present invention taken in a direction along a resonator. FIG. 8 is a sectional view in the vicinity of an end surface of the resonator shown in FIG. 7. FIG. 9 is a sectional view at a center of the resonator shown in FIG. 7.

In outside of the ridge 17, the thickness of the p-AlGaN clad layer 16 in the vicinities of resonator end surfaces is larger than the thickness of the p-AlGaN clad layer 16 at the resonator center. In other respects, the construction in the second embodiment is the same as that in the first embodiment.

Figure 10:
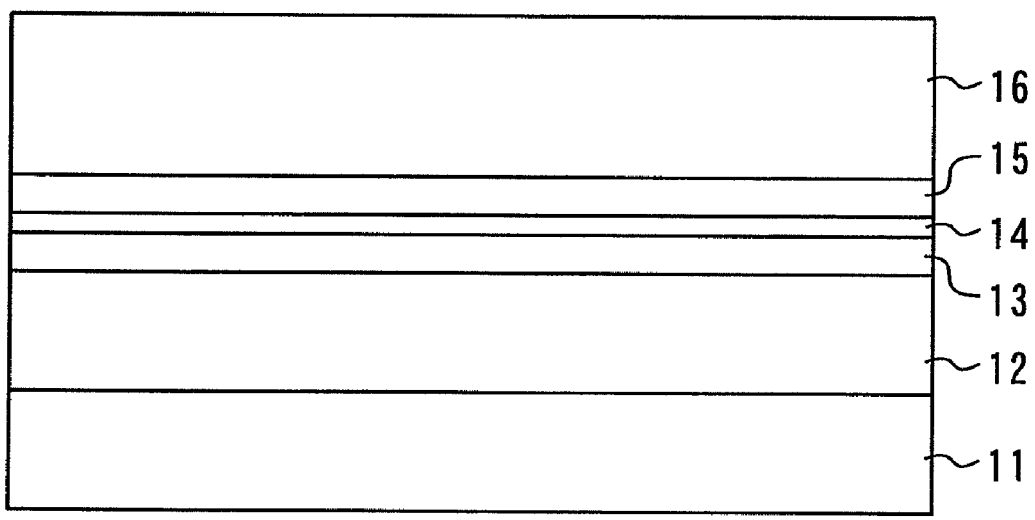
FIGS. 10-13 are sectional views for explaining a method of manufacturing a semiconductor laser according to a second embodiment of the present invention.

The process of manufacturing the semiconductor laser according to the present embodiment will be described. First, as shown in FIG. 10, the n-AlGaN clad layer 12, the guide layer 13, the quantum well active layer 14, the guide layer 15 and the p-AlGaN clad layer 16 are formed on the n-GaN substrate 11.

Figure 11:
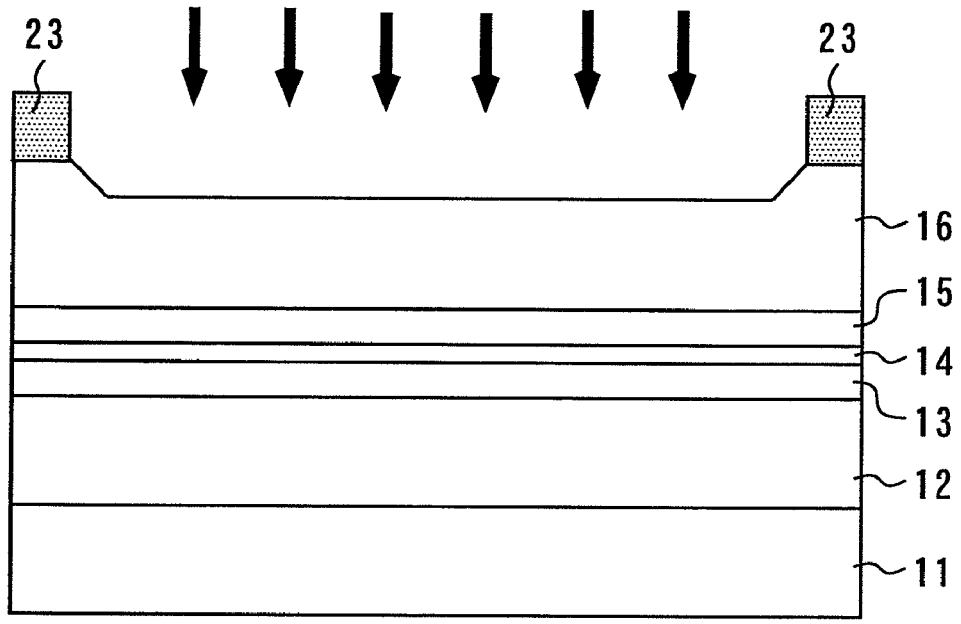

Next, as shown in FIG. 11, a resist 23 is formed in the vicinities of the resonator end surfaces by photolithography. The p-AlGaN clad layer 16 is etched by using this resist 23 as a mask so that the thickness of the p-AlGaN clad layer 16 in the vicinities of the resonator end surfaces is larger than the thickness of the p-AlGaN clad layer 16 at the resonator center. Thereafter, the p-GaN contact layer 18 is formed on the p-AlGaN clad layer 16.

Figure 12:
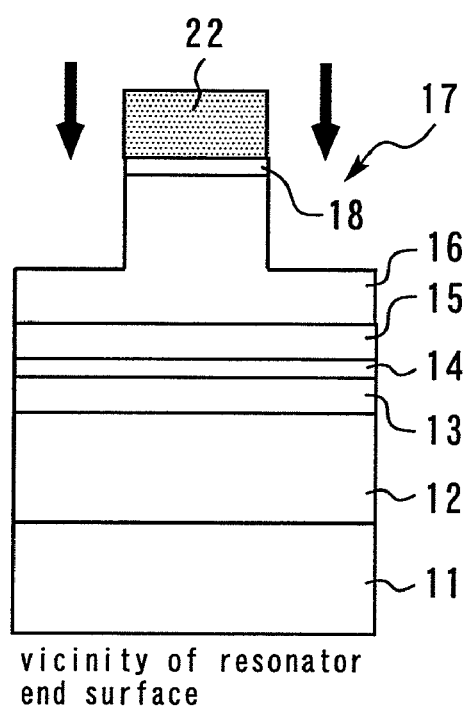
Figure 13:
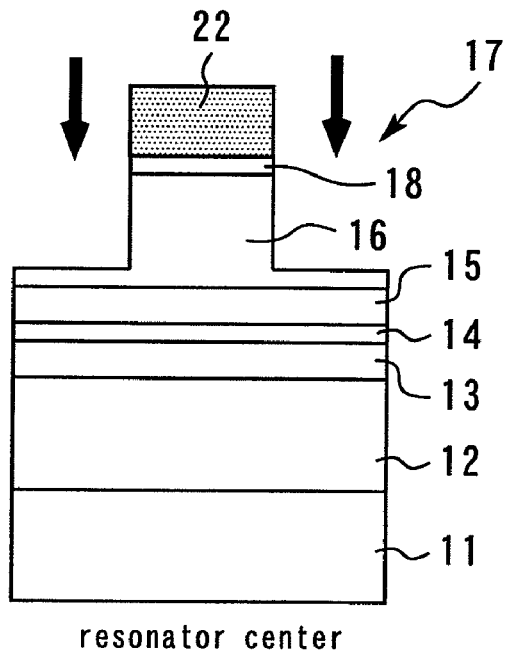

Subsequently, as shown in FIGS. 12 and 13, the ridge 17 is formed by etching the p-GaN contact layer 18 and the p-AlGaN clad layer 16. For this etching, a resist 22 patterned by photolithography is used as a mask. Since the thickness of the p-AlGaN clad layer 16 in the vicinities of the resonator end surfaces is larger than the thickness of the p-AlGaN clad layer 16 at the resonator center, the thickness of the p-AlGaN clad layer 16 in the vicinities of the resonator end surfaces in the outside of the ridge 17 can also be made larger than the thickness of the p-AlGaN clad layer 16 at the resonator center in the outside of the ridge 17 by uniformly performing etching.

Subsequently, as shown in FIGS. 7 to 9, the p-electrode 19 is formed on the ridge 17. The n-electrode 20 is formed on the lower surface of the n-GaN substrate 11. The insulating film 21 is formed so as to cover the side wall surfaces of the ridge 17 and the p-AlGaN clad layer 16 in the outside of the ridge 17. The semiconductor laser according to the present embodiment is manufactured by the above-described process.

In the semiconductor laser according to the present embodiment, as described above, the thickness of the p-AlGaN clad layer 16 in the vicinities of the resonator end surfaces in the outside of the ridge 17 is larger than the thickness of the p-AlGaN clad layer 16 at the resonator center in the outside of the ridge 17. Because of this construction, a strain of the quantum well active layer 14 in the vicinities of the resonator end surfaces with respect to the p-AlGaN clad layer 16 is increased. Also, the thickness of the p-AlGaN clad layer in the vicinities of the resonator end surfaces is increased in the outside of the ridge 17 relative to that in the first embodiment. Therefore, a current larger than that in the first embodiment spreads laterally from positions below the side walls of the ridge 17, and the current density in the vicinities of the resonator end surfaces is further reduced, thus enabling prevention of end surface deterioration with improved reliability.

Third Embodiment

Figure 14:
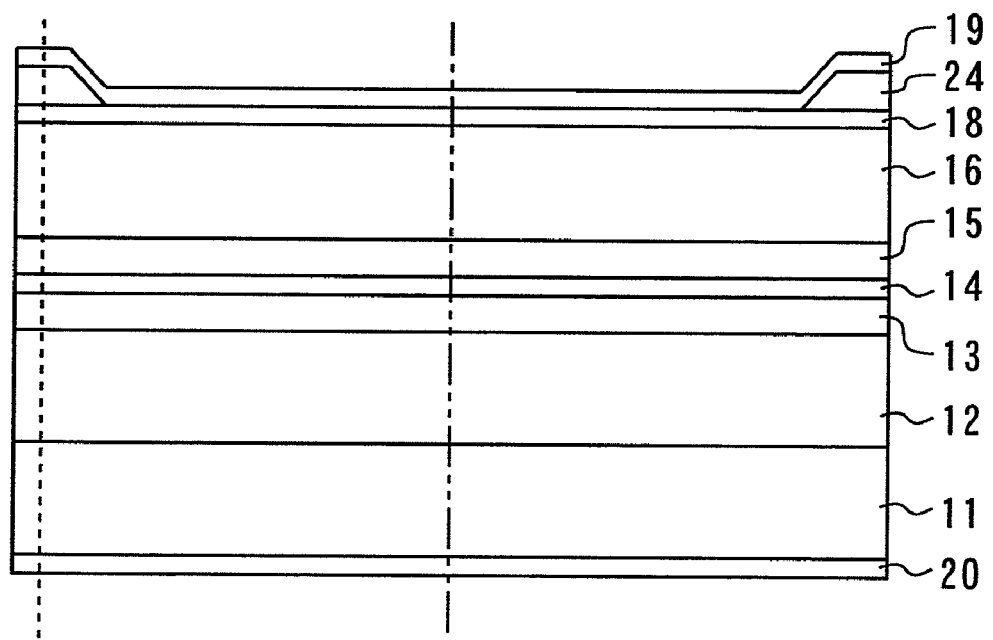
FIG. 14 is a sectional view of a semiconductor laser according to a third embodiment of the present invention taken in a direction along a resonator.
Figure 15:
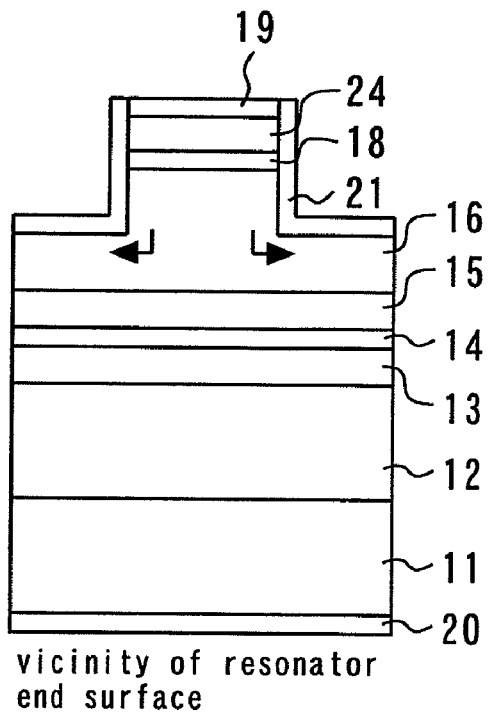
FIG. 15 is a sectional view in the vicinity of an end surface of the resonator shown in FIG. 14.
Figure 16:
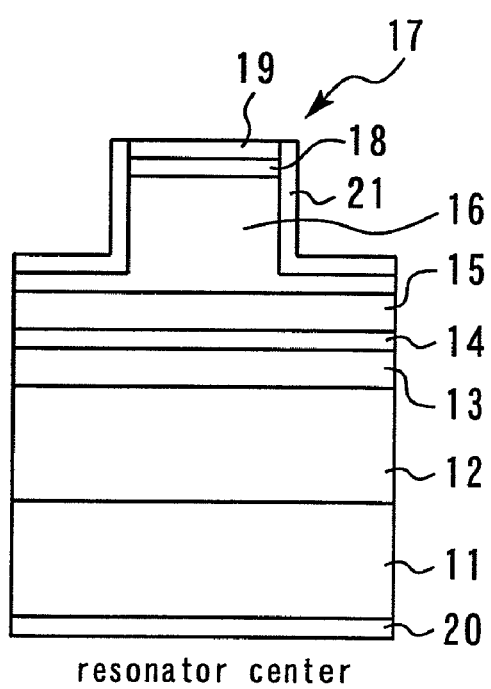
FIG. 16 is a sectional view at a center of the resonator shown in FIG. 14.

FIG. 14 is a sectional view of a semiconductor laser according to a third embodiment of the present invention taken in a direction along a resonator. FIG. 15 is a sectional view in the vicinity of an end surface of the resonator shown in FIG. 14. FIG. 16 is a sectional view at a center of the resonator shown in FIG. 14.

An n-AlGaN clad layer 12 (lower clad layer), a guide layer 13, a quantum well active layer 14 (active layer), a guide layer 15, a p-AlGaN clad layer 16 (upper clad layer) and a p-GaN contact layer 18 (contact layer) are formed one on another on an n-GaN substrate 11 (semiconductor substrate).

A feature of the present embodiment resides in that a p-AlGaN clad layer 24 (second upper clad layer) is formed on the p-GaN contact layer 18 only in the vicinities of resonator end surfaces but is not formed on at a resonator center. A ridge 17 is formed on the p-AlGaN layers 16 and 24 and the p-GaN contact layer 18. A p-electrode 19 is formed on the ridge 17. An n-electrode is formed on the lower surface of the n-GaN substrate 11. An insulating film 21 is formed so as to cover side wall surfaces of the ridge 17 and the p-AlGaN clad layer 16 in outside of the ridge 17.

Figure 17:
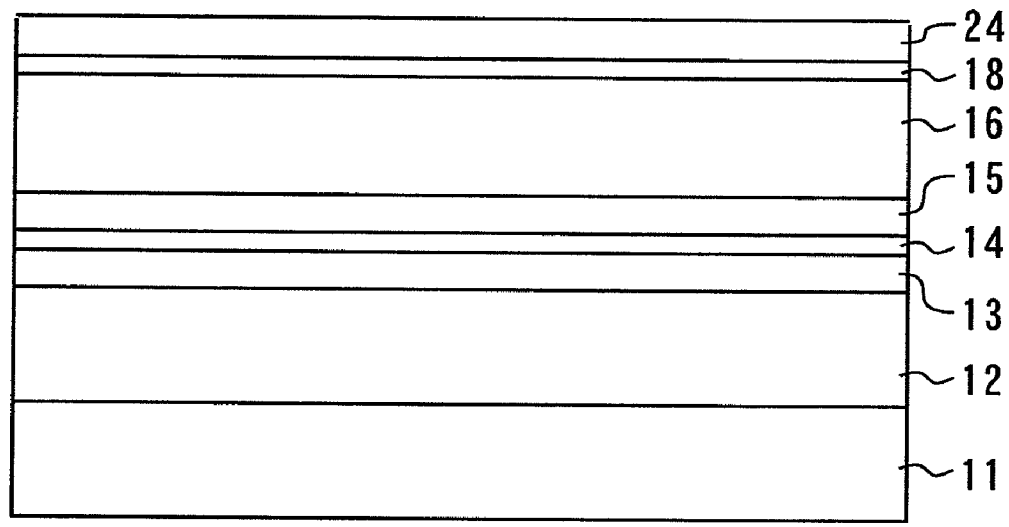
FIGS. 17-20 are sectional views for explaining a method of manufacturing a semiconductor laser according to a third embodiment of the present invention.

The process of manufacturing the semiconductor laser according to the present invention will be described. First, as shown in FIG. 17, the n-AlGaN clad layer 12, the guide layer 13, the quantum well active layer 14, the guide layer 15 and the p-AlGaN clad layer 16, the p-GaN contact layer 18 and the p-AlGaN clad layer 24 are formed on the n-GaN substrate 11.

Figure 18:
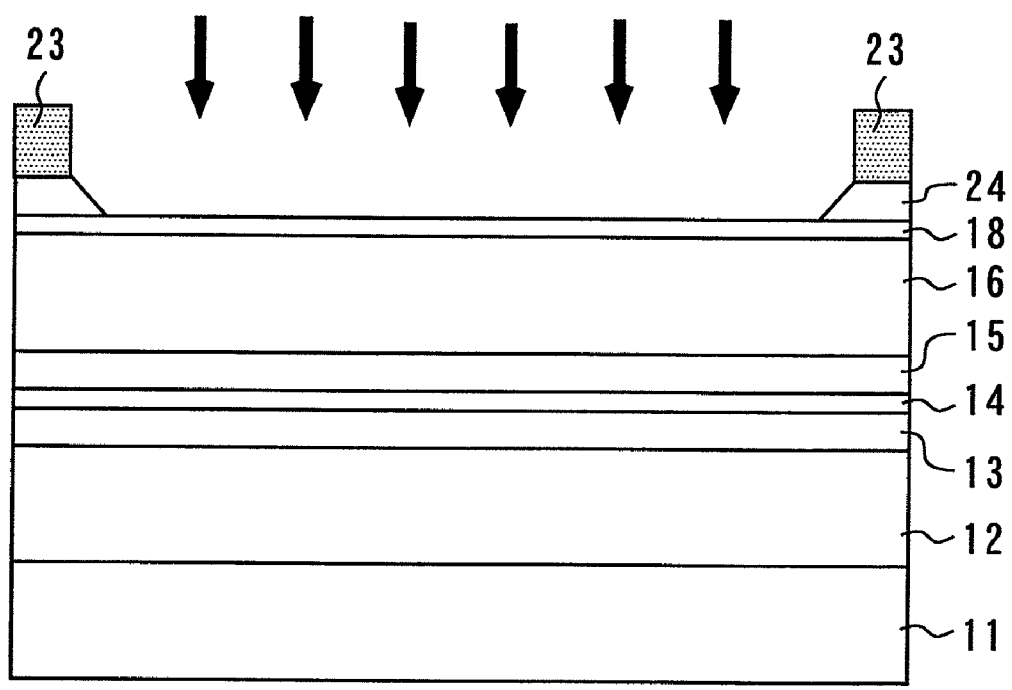

Next, as shown in FIG. 18, a resist 23 is formed in the vicinities of the resonator end surfaces by photolithography. The p-AlGaN clad layer 24 is etched by using this resist 23 as a mask. The p-AlGaN clad layer 24 at the resonator center is removed thereby.

Figure 19:
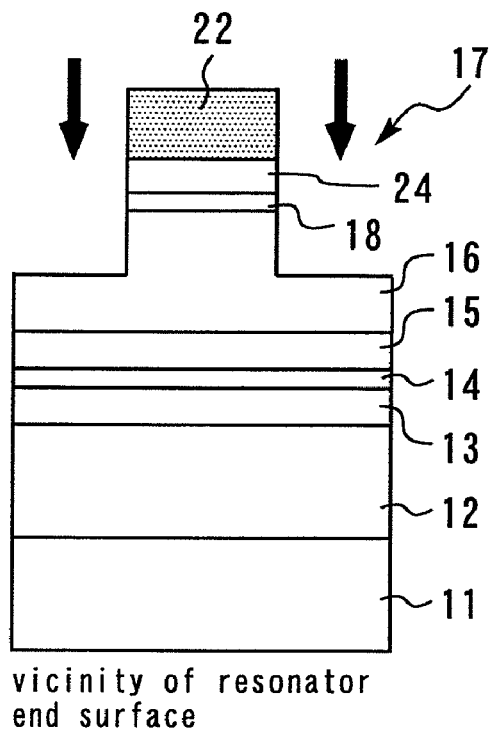
Figure 20:
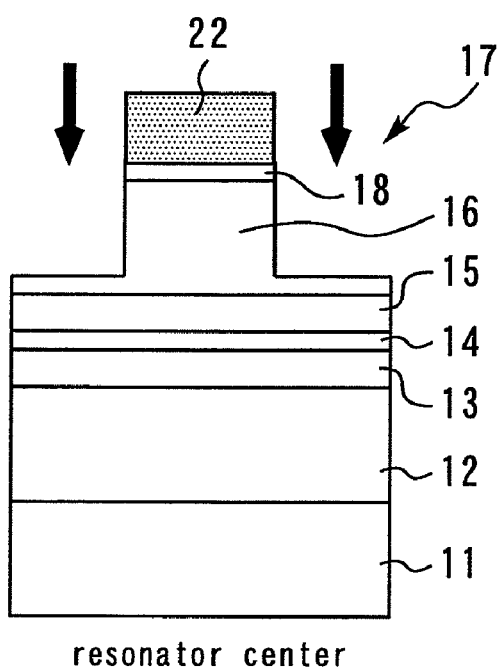

Subsequently, as shown in FIGS. 19 and 20, the ridge 17 is formed by etching the p-AlGan clad layer 24, the p-GaN contact layer 18 and the p-AlGaN clad layer 16. For this etching, a resist 22 patterned by photolithography is used as a mask.

Subsequently, as shown in FIGS. 14 to 16, the p-electrode 19 is formed on the ridge 17. The n-electrode 20 is formed on the lower surface of the n-GaN substrate 11. The insulating film 21 is formed so as to cover the side wall surfaces of the ridge 17 and the p-AlGaN clad layer 16 in the outside of the ridge 17. The semiconductor laser according to the present embodiment is manufactured by the above-described process.

In the semiconductor laser according to the present embodiment, as described above, the p-AlGaN clad layer 24 is formed only in the vicinities of the resonator end surfaces. Because of this construction, the bandgap of the quantum well active layer 14 in the vicinities of the resonator end surfaces is increased relative to the bandgap of the quantum well active layer 14 at the resonator center (oscillation section). Also, a current spreads laterally from positions below the side walls of the ridge 17, and the current density in the vicinities of the resonator end surfaces is reduced, thus enabling prevention of end surface deterioration.

The semiconductor laser according to the present embodiment can be easily manufactured by etching the p-AlGaN clad layer 24 at the resonator center. There is no need for regrowing of the contact layer or the like after etching. Therefore, growing can be performed with improved reproducibility.

In the semiconductor laser according to the present embodiment, the positions at which the structure of the p-AlGaN clad layer 24 is changed are at a substantial distance from the quantum well active layer 14. Therefore, changes in the light distribution and current distribution in the direction along the resonator are gradual. As a result, stable laser oscillation can be achieved.

It is desirable that the proportion of Al in the composition of the p-AlGaN clad layer 24 be larger than the proportion of Al in the composition of the p-AlGaN clad layer 16. If the proportion of Al is increased, the compressive strain with respect to the quantum well active layer 14 becomes larger. Therefore, prevention of end surface deterioration is enabled with improved reliability by increasing the proportion of Al.

In the present embodiment, the thickness of the p-AlGaN clad layer 16 in the vicinities of the resonator end surfaces in the outside of the ridge 17 is larger than the thickness of the p-AlGaN clad layer 16 at the resonator center in the outside of the ridge 17. However, the present invention is not limited to this. The thickness of the p-AlGaN clad layer 16 in the vicinities of the resonator end surfaces in the outside of the ridge 17 and the thickness of the p-AlGaN clad layer 16 at the resonator center in the outside of the ridge 17 may be equal to each other.

Fourth Embodiment

Figure 21:
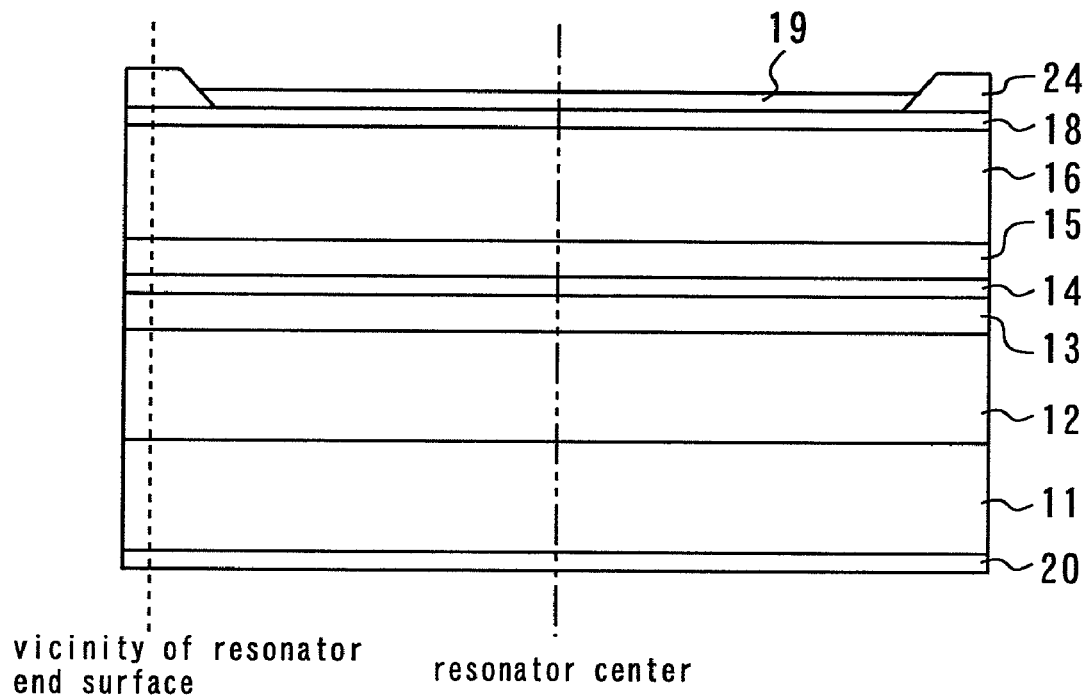
FIG. 21 is a sectional view of a semiconductor laser according to a fourth embodiment of the present invention taken in a direction along a resonator.
Figure 22:
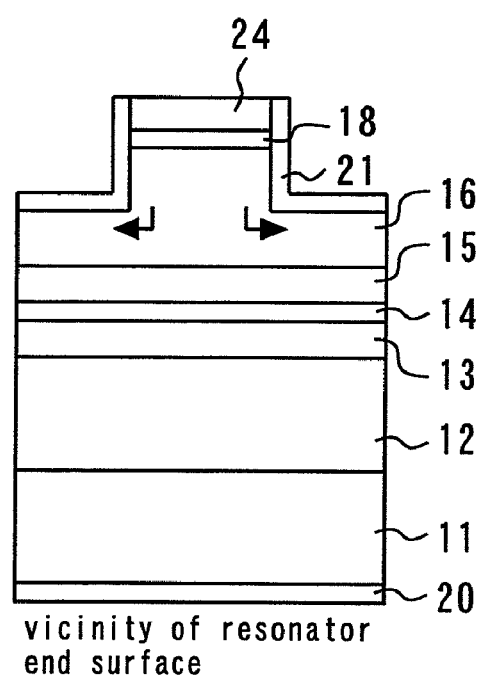
FIG. 22 is a sectional view in the vicinity of an end surface of the resonator shown in FIG. 21.
Figure 23:
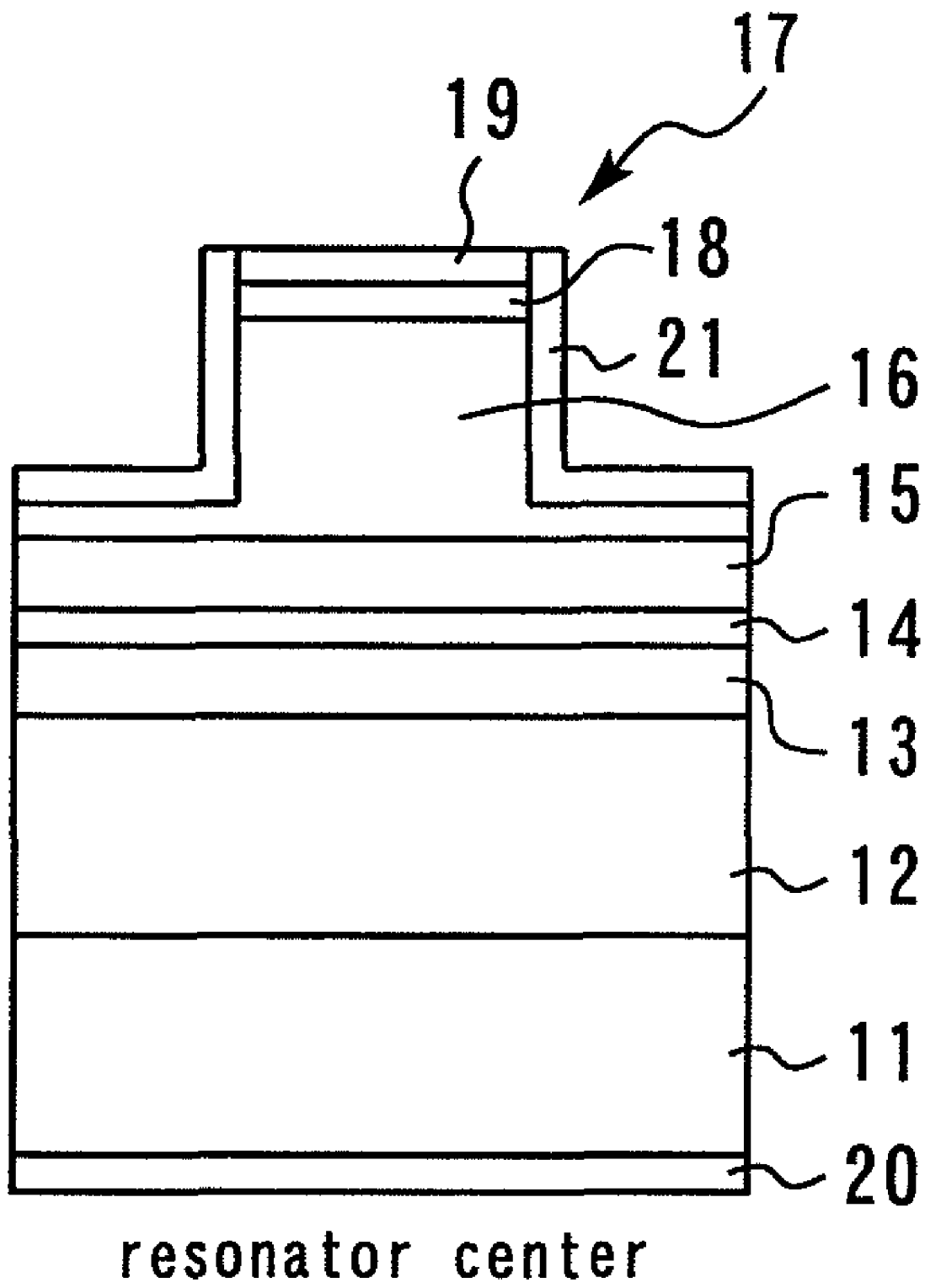
FIG. 23 is a sectional view at a center of the resonator shown in FIG. 21.

FIG. 21 is a sectional view of a semiconductor laser according to a fourth embodiment of the present invention taken in a direction along a resonator. FIG. 22 is a sectional view in the vicinity of an end surface of the resonator shown in FIG. 21. FIG. 23 is a sectional view at a center of the resonator shown in FIG. 21.

A p-electrode 19 (electrode) is formed on a p-GaN contact layer 18 but is not formed on the p-AlGaN clad layer 24. In other respects, the construction is the same as that in the third embodiment.

The semiconductor laser thus constructed can be manufactured by selectively growing the p-electrode 19 on the p-GaN contact layer 18 while covering the p-AlGaN clad layer 24 with a mask or by forming the p-electrode 19 on the entire surface and thereafter etching the p-electrode 19 on the p-AlGaN clad layer 24.

This construction enables reducing the current flowing in the vicinities of the resonator end surfaces, thus enabling prevention of end surface deterioration with improved reliability.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-017309, filed on Jan. 29, 2008 including specification, claims, drawings and summary, on which the Convention priority of the present application is based, are incorporated herein by reference in its entirety.

What is claimed is:

1. A semiconductor laser comprising:
    a semiconductor substrate;
    a lower cladding layer, an active layer, and an upper cladding layer stacked in that order on the semiconductor substrate and forming a resonator having resonator end surfaces; and
    a ridge including part of the upper cladding layer, wherein the part of the upper cladding layer in the ridge and proximate the resonator end surfaces is sufficiently thicker than the part of the upper cladding layer in the ridge and at a resonator center, between and spaced from the resonator end surfaces, so that bandgap energy of the active layer is increased at the resonator end surface relative to the bandgap energy of the active layer at the resonator center.

2. The semiconductor laser according to claim 1, wherein the part of the upper cladding layer not in the ridge is thicker proximate the resonator end surfaces than the part of the upper clad layer not in the ridge and at the resonator center, between and spaced from the resonator end surfaces.

3. A semiconductor laser comprising:
    a semiconductor substrate;
    a lower cladding layer, an active layer, a first upper cladding layer, and a contact layer stacked in that order on the semiconductor substrate and forming a resonator having resonator end surfaces;
    a second upper cladding layer on the contact layer proximate the resonator end surfaces, but not present at a resonator center, between and spaced from the resonator end surfaces; and
    a ridge on and including part of the first upper cladding layer and including the second upper cladding layer and the contact layer.

4. The semiconductor laser according to claim 3, wherein the first and second upper cladding layers are AlGaN, and the proportion of Al in the second upper cladding layer is larger than the proportion of Al in the first upper cladding layer.

5. The semiconductor laser according to claim 3, further comprising an electrode on the contact layer but not on the second upper cladding layer.

* * * * *